(12) United States Patent
Hieb et al.

(10) Patent No.: US 12,224,223 B1
(45) Date of Patent: Feb. 11, 2025

(54) ADAPTIVE STRUCTURE FOR THERMAL REGULATION AND OPTIMIZATION

(71) Applicant: Raytheon Company, Waltham, MA (US)

(72) Inventors: Edward L. Hieb, Plano, TX (US); Nicholas C. Day, Bowling Green, KY (US); Ken Salas Nobrega, Tucson, AZ (US)

(73) Assignee: Raytheon Company, Arlington, VA (US)

( * ) Notice: Subject to any disclaimer, the term of this patent is extended or adjusted under 35 U.S.C. 154(b) by 545 days.

(21) Appl. No.: 17/499,040

(22) Filed: Oct. 12, 2021

Related U.S. Application Data

(60) Provisional application No. 63/117,326, filed on Nov. 23, 2020.

(51) Int. Cl.
| | |
|---|---|
| *H01L 23/367* | (2006.01) |
| *B22F 10/28* | (2021.01) |
| *B33Y 10/00* | (2015.01) |
| *B33Y 40/20* | (2020.01) |
| *B33Y 80/00* | (2015.01) |
| *H01L 21/48* | (2006.01) |
| *H01L 23/373* | (2006.01) |

(52) U.S. Cl.
CPC .......... *H01L 23/3675* (2013.01); *B22F 10/28* (2021.01); *B33Y 10/00* (2014.12); *B33Y 40/20* (2020.01); *B33Y 80/00* (2014.12); *H01L 21/4871* (2013.01); *H01L 23/3736* (2013.01); *B22F 2301/10* (2013.01); *B22F 2301/20* (2013.01)

(58) Field of Classification Search
CPC ......... B22F 10/28; B33Y 10/00; B33Y 80/00; B33Y 40/20; H01L 21/4871; H01L 23/3736
See application file for complete search history.

(56) References Cited

U.S. PATENT DOCUMENTS

| | | |
|---|---|---|
| 5,455,738 A | 10/1995 | Montesano et al. |
| 8,048,366 B2 | 11/2011 | Zhu et al. |
| (Continued) | | |

OTHER PUBLICATIONS

Mostafaei et al., "Binder jet 3D printing—Process parameters, materials, properties, modeling, and challenges", Progress in Materials Science, Jun. 2020, 138 pages.

(Continued)

*Primary Examiner* — Moazzam Hossain

(57) ABSTRACT

A method includes forming an initial structure having voids, where the initial structure includes one or more first materials. The method also includes infiltrating one or more second materials into the initial structure, where the one or more second materials are different from the one or more first materials. The method further includes forming a finished structure configured to receive and support one or more heat-generating components. A combination of the first and second materials provides a coefficient of thermal expansion in a portion of the finished structure that substantially matches a coefficient of thermal expansion of the one or more heat-generating components. The finished structure is configured to provide a path to remove thermal energy from the one or more heat-generating components.

20 Claims, 5 Drawing Sheets

(56) References Cited

U.S. PATENT DOCUMENTS

2008/0102304 A1\* 5/2008 Breit .................. H01L 23/3733
428/596
2019/0393117 A1\* 12/2019 Vockenberger ....... H01L 23/367

OTHER PUBLICATIONS

Xu et al., "Structurally Efficient Three-dimensional Metamaterials with Controllable Thermal Expansion", Scientific Reports, Oct. 2016, 12 pages.
Muller et al., "Additive manufacturing of pure tungsten by means of selective laser beam melting with substrate preheating temperatures up to 1000 C", Nuclear Materials and Energy, Mar. 2019, 5 pages.
"Lockheed Martin Announces $100 Million Venture Fund Increase", Aviation Maintenance Magazine, avm-mag.com, Jun. 2018, 3 pages.
"HSMR-CL25, 0.25mm Blue Leadframe-Based Surface Mount ChipLED", Avago Technologies, May 2009, 7 pages.
"Renishaw showcases metal AM implants to American Academy of Orthopaedic Surgeons", metal-am.com, Mar. 2018, 3 pages.
Favre et al., "A continuous crystallographic approach to generate cubic lattices and its effect on relative stiffness of architectured materials", HAL, Apr. 2018, 12 pages.
Pawlowski et al., "Damage-tolerant metallic composites via melt infiltration of additively manufactured preforms", Material & Design, Apr. 22, 2017, 7 pages.
Xu et al., "Environment-friendly and reusable ink for 3D printing of metallic structures", Materials and Design, Sep. 2018, 8 pages.

\* cited by examiner

ADAPTIVE STRUCTURE FOR THERMAL REGULATION AND OPTIMIZATION

CROSS-REFERENCE TO RELATED APPLICATION AND PRIORITY CLAIM

This application claims priority under 35 U.S.C. § 119 (e) to U.S. Provisional Patent Application No. 63/117,326 filed on Nov. 23, 2020, which is hereby incorporated by reference in its entirety.

TECHNICAL FIELD

This disclosure relates generally to thermal management systems. More specifically, this disclosure relates to an adaptive structure for thermal regulation and optimization.

BACKGROUND

High-powered electronic devices, such as monolithic microwave integrated circuits (MMICs), often require dimensional stability by matching their coefficients of thermal expansion (CTEs) with mating surfaces of components in larger assemblies while also providing efficient thermal architectures to regulate the temperatures of the electronic devices. Because of this, reductions in CTE mismatches and efficient heat transfer mechanisms are often important or useful for overall package reliability in many applications, especially with large and/or cyclical temperature gradients or significant overload conditions.

SUMMARY

This disclosure provides an adaptive structure for thermal regulation and optimization.

In a first embodiment, a method includes forming an initial structure having voids, where the initial structure includes one or more first materials. The method also includes infiltrating one or more second materials into the initial structure, where the one or more second materials are different from the one or more first materials. The method further includes forming a finished structure configured to receive and support one or more heat-generating components. A combination of the first and second materials provides a coefficient of thermal expansion in a portion of the finished structure that substantially matches a coefficient of thermal expansion of the one or more heat-generating components. The finished structure is configured to provide a path to remove thermal energy from the one or more heat-generating components.

In a second embodiment, an apparatus includes an initial structure having voids, where the initial structure includes one or more first materials. The apparatus also includes one or more second materials infiltrated into the initial structure, where the one or more second materials are different from the one or more first materials. The apparatus is configured to receive and support one or more heat-generating components. A combination of the first and second materials provides a coefficient of thermal expansion in a portion of the apparatus that substantially matches a coefficient of thermal expansion of the one or more heat-generating components. The apparatus is configured to provide a path to remove thermal energy from the one or more heat-generating components.

In a third embodiment, a system includes one or more heat-generating components. The system also includes an apparatus configured to support the one or more heat-generating components and remove thermal energy from the one or more heat-generating components. The apparatus includes an initial structure having voids, where the initial structure includes one or more first materials. The apparatus also includes one or more second materials infiltrated into the initial structure, where the one or more second materials are different from the one or more first materials. A combination of the first and second materials provides a coefficient of thermal expansion in a portion of the apparatus that substantially matches a coefficient of thermal expansion of the one or more heat-generating components. The apparatus is configured to provide a path to remove the thermal energy from the one or more heat-generating components.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
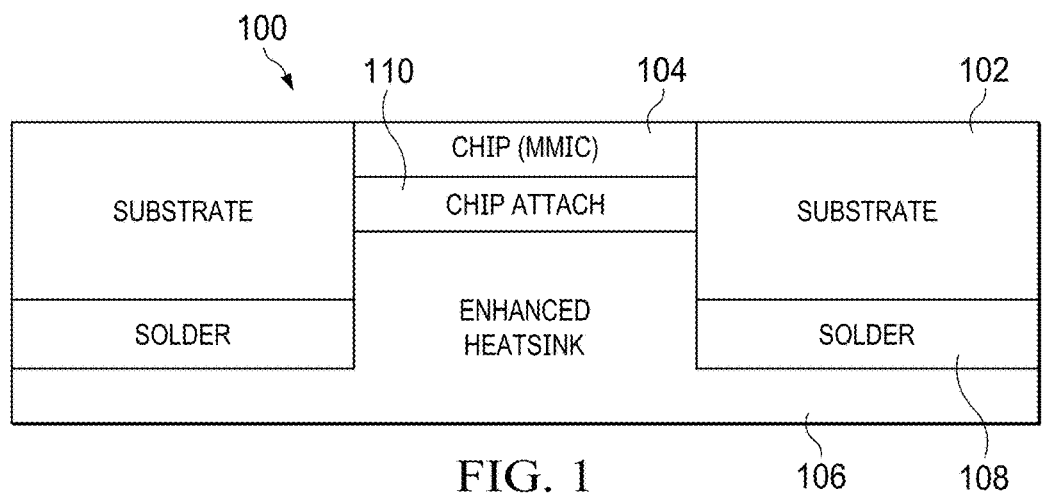
FIG. 1 illustrates an example assembly formed using an enhanced heatsink in accordance with this disclosure.

FIGS. 1 through 7B, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, high-powered electronic devices, such as monolithic microwave integrated circuits (MMICs), often require dimensional stability by matching their coefficients of thermal expansion (CTEs) with mating surfaces of components in larger assemblies while also providing efficient thermal architectures to regulate the temperatures of the electronic devices. Because of this, reductions in CTE mismatches and efficient heat transfer mechanisms are often important or useful for overall package reliability in many applications, especially with large and/or cyclical temperature gradients or significant overload conditions.

Some approaches use sub-assemblies containing thermal spreaders made with alloys that are formulated to create tailored CTEs to match integrated components at the next assembly level while retaining sufficient thermal conductivity to conductively cool electronic components. However, these approaches are typically limited to using powdered metallurgy and to standard sheet thicknesses. These approaches often offer no ability to tailor three-dimensional (3D) gradients of mechanical property values throughout their volumes. These approaches are also often restricted from customization in designing different values of mechanical properties within the same part due to the monolithic/uniformity of material composition and manufacturing process.

This disclosure provides various adaptive structures for thermal regulation and optimization. As described in more detail below, novel techniques can be used to additively manufacture receiving structures that may be designed using at least one architected material (such as molybdenum). The architected material(s) can be used to strategically introduce density gradients that tailor mechanical properties (such as CTE and stiffness) in three dimensions. In some cases, the additively-manufactured receiving structures can be created using a laser powder bed fusion process. The resulting structures can be infiltrated with at least one dissimilar material (such as copper), and any desired finishing or other post-processing operations may occur.

Each finished product can represent a metal-matrix composite part that has the ability to solve matching CTE issues, which can be achieved by synthetically adapting the material composition of the finished product to match multiple different target values for CTE, stiffness, and other mechanical properties while maintaining efficient thermal paths for heat transfer. The process is adaptive in that the design of a unique set of mechanical properties can be rapidly updated and produced in parts to optimize the design of thermally-regulated and dimensionally-stable assemblies. The ability to intentionally incorporate multiple different values of mechanical properties in localized regions throughout a single part allows the part to be designed with near-limitless macro-geometries in multiple dimensions (such as in the X, Y, and Z dimensions) and to integrate with various components in an assembly that all have different CTEs, while the part substantially or exactly matches those CTEs at local interfaces and provides an efficient thermal path for heat transfer.

In some embodiments, these techniques allow one or more 3D-printable refractory metals to serve as a scaffold, which can be customizable in multiple dimensions to create initial structures for receiving conductive metal infiltrations, such as copper. The resulting finished products incorporate structures that have high thermal conductivities and custom-tuned CTEs in order to hold dimensional stability over a range of temperatures.

This type of approach may be used in a number of applications. For example, a radar system's Transmit/Receive Integrated Multichannel Module (TRIMM) package or other package may need to provide for thermal management of high-heat dissipative electronics like high-power amplifiers, MMICs, couplers, and radio frequency system-on-a-chip (RFSoC) components. The described techniques may therefore be used to design and fabricate structural components that receive or otherwise interface with these high-heat dissipative electronics. As other examples, medical equipment, precision sensing equipment or other precision instruments, satellite antennas, space optical systems, thermal actuators, and micro-electro-mechanical system (MEMS) devices may include or be used with structural components designed in accordance with this disclosure. In general, any component(s) where high dimensional stability under heat may be required or desired can include one or more structural components designed to interface with the component(s).

FIG. 1 illustrates an example assembly 100 formed using an enhanced heatsink in accordance with this disclosure. As shown in FIG. 1, the assembly 100 includes a substrate 102 and at least one semiconductor device 104 mounted on or in, carried by, or otherwise associated with the substrate 102. The substrate 102 represents any suitable substrate on or in which one or more semiconductor devices or other circuit components can be carried. The substrate 102 may be formed from any suitable material(s) (such as silicon, sapphire, gallium nitride, gallium arsenide, silicon carbide, or other semiconductor substrate material) and in any suitable manner. The substrate 102 may also have any suitable size, shape, and dimensions.

Each semiconductor device 104 represents an integrated circuit chip or other circuit component that can operate and perform a wide variety of functions and that can generate thermal energy during operation. For instance, at least one semiconductor device 104 may represent a silicon, gallium nitride, gallium arsenide, or silicon carbide semiconductor device. While a single semiconductor device 104 is shown here as residing within the substrate 102, multiple semiconductor devices 104 may be used, and each semiconductor device 104 may be positioned on, above, below, or within the substrate 102.

A heatsink 106 is used in the assembly 100 to remove thermal energy from the semiconductor device 104 in order to cool the semiconductor device 104, such as to maintain the semiconductor device 104 within a specified or desired operating temperature range or below a specified or desired temperature threshold. Often times, the semiconductor device 104 needs or requires contact with one or more CTE-matched materials for thermal regulation. In some conventional approaches, a heatsink may be formed using a homogeneous sheet alloy (such as aluminum-plated copper) that is bonded to a parent thermal structure, which is itself bonded to the semiconductor device 104. However, as noted above, this approach often offers no ability to tailor 3D gradients of mechanical property values and is restricted from customization in designing different values of mechanical properties within the same part. In FIG. 1, the heatsink 106 represents an enhanced heatsink that can be designed and fabricated, as described in more detail below, to provide a substantial CTE match to the semiconductor device 104 while providing good thermal regulation of the semiconductor device 104. Among other things, the enhanced heatsink 106 here supports part consolidation by reducing the number of parts and removing the need to use certain epoxy bond/thermal interfaces often used in conventional approaches (which can help reduce temperature rises). The enhanced heatsink 106 also promotes design complexity and allows for the possibility of conformal geometries and multiple different CTE values within the same part.

In this particular example, the heatsink 106 can be mounted on or attached to the substrate 102 using solder 108, such as indium solder. Also, the semiconductor device 104 can be mounted on or attached to the substrate 102 using a chip attach material 110, such as a thermally conductive epoxy (like the 1295SA silver epoxy from SUMITOMO CHEMICAL CO.) or other adhesive. However, the semiconductor device 104 and the heatsink 106 can be mounted on or attached to the substrate 102 using any suitable material(s).

Although FIG. 1 illustrates one example of an assembly 100 formed using an enhanced heatsink 106, various changes may be made to FIG. 1. For example, the assembly 100 may include any suitable number of each illustrated component. Also, enhanced heatsinks designed and fabricated in accordance with this disclosure may have a wide variety of forms and applications, and FIG. 1 does not limit this disclosure to any particular implementation or use of an enhanced heatsink 106.

Figure 2:
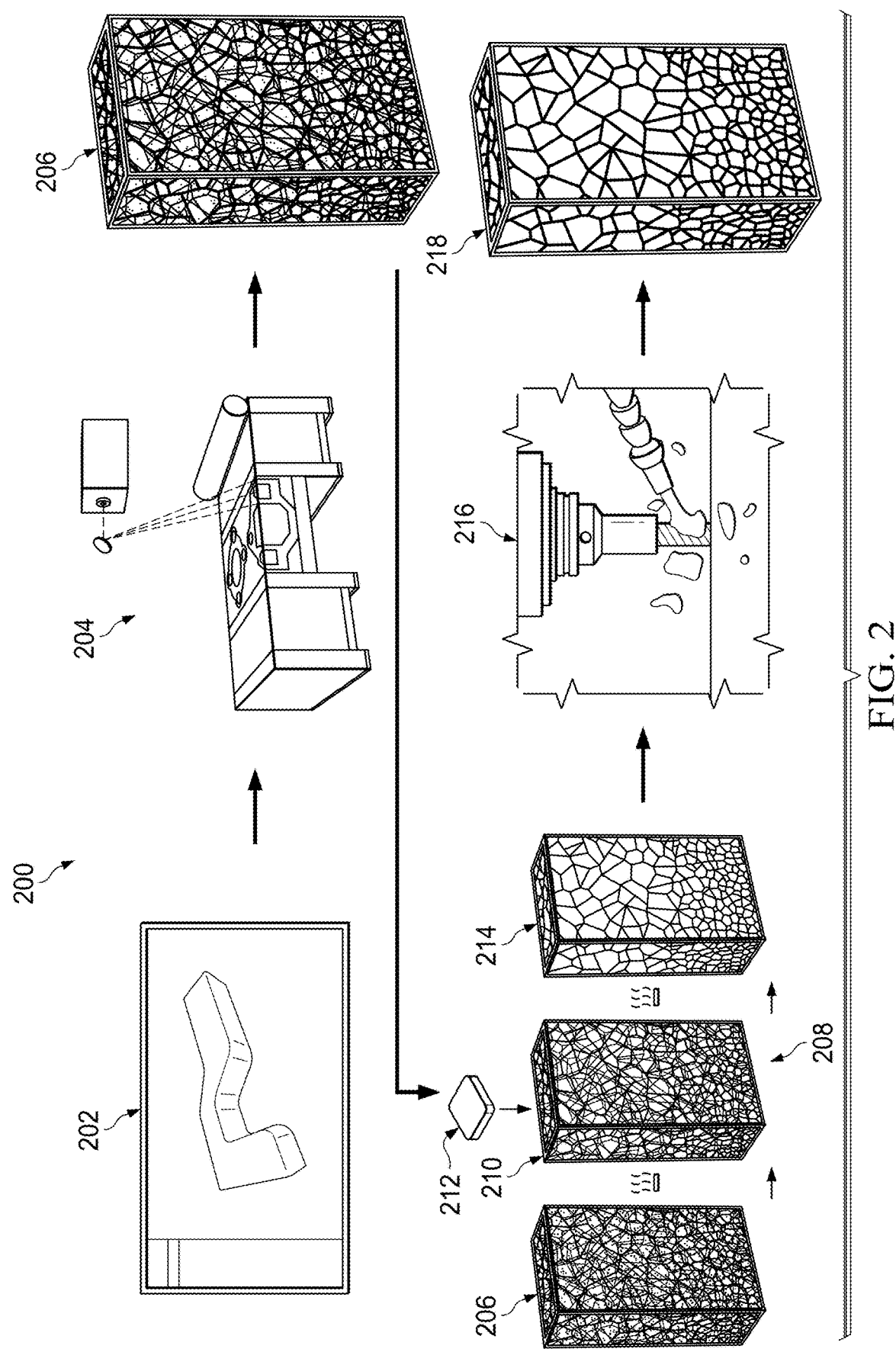
FIG. 2 illustrates an example multi-step approach to create a structure that is capable of intentionally containing different mechanical properties in various locations within the same structure in accordance with this disclosure.

FIG. 2 illustrates an example multi-step approach 200 to create a structure that is capable of intentionally containing different mechanical properties in various locations within the same structure in accordance with this disclosure. The multi-step approach 200 shown in FIG. 2 may, for example, be used to form the enhanced heatsink 106 in the assembly 100 of FIG. 1 or other suitable structure. The multi-step approach 200 may be used to create a structure (such as the enhanced heatsink 106) that is capable of intentionally having different mechanical properties (such as different CTEs) in various locations within the same structure.

As shown in FIG. 2, the approach 200 includes generating a design 202 for a structure to be fabricated. The design 202 here may be generated in any suitable manner, such as by using computer-aided design (CAD) software and topology optimization software. The design 202 of the structure here represents a potential design for a structure that will eventually be used to receive and support one or more heat-generating components.

The design 202 is used by a 3D printer or other additive manufacturing system 204 to produce an initial structure 206. The initial structure 206 is formed using one or more first materials, such as one or more refractory metals (like molybdenum). The initial structure 206 may sometimes be referred to as a "skeleton." The additive manufacturing system 204 may use any suitable technique to fabricate the initial structure 206. As a particular example, additive manufacturing of molybdenum, such as through the use of a laser powder bed fusion (LPBF) process, may be used to form the initial structure 206.

An infiltration process 208 is performed in order to infuse or otherwise infiltrate at least one liquid material into the initial structure 206. The at least one liquid material includes one or more second materials different from the one or more first materials. For example, the at least one liquid material may represent copper. As shown in this example, the infiltration process 208 may include a sintering operation performed on the initial structure 206 to produce a sintered structure 210. Sintering generally operates to compact the material forming the initial structure 206 and reduce the porosity of the initial structure 206 to form the sintered structure 210. Material 212 is liquified (if not already in liquid form) and infiltrated into the sintered structure 210, which may be performed at elevated pressure. This results in the formation of an infiltrated structure 214 in which at least some of the voids within the sintered structure 210 have been at least partially filed with the material 212. For example, copper or other liquid metal infiltration may be performed to at least partially fill intentionally designed-in voids contained in the initial structure 206.

The infiltrated structure 214 can be subjected to one or more desired post-processing operations 216 to produce a finished structure 218. Any suitable post-processing operations 216 may be performed here, such as one or more cleaning or finishing operations. The finished structure 218 represents an architected combination of (i) two or more materials or (ii) two or more materials and empty space. The architected combination is configured in such a way as to have attributes not offered by any one material alone. The finished structure 218 also represents a structure that is configured to (i) receive the one or more heat-generating components, (ii) have at least one portion that is very closely or exactly matched to the CTE of the one or more heat-generating components, and (iii) provide a thermal pathway to remove thermal energy from the one or more heat-generating components. Here, the material(s) used to form the initial structure 206 and the material(s) 212 infiltrated into the initial structure 206, as well as the overall design of the initial structure 206, may be selected to tailor mechanical properties (such as CTEs) and provide an efficient thermal path for heat transfer.

Although FIG. 2 illustrates one example of a multi-step approach 200 to create a structure 218 that is capable of intentionally containing different mechanical properties in various locations within the same structure 218, various changes may be made to FIG. 2. For example, each operation of the approach 200 may be performed using any suitable device(s) or system(s). While specific devices or systems are described above (such as the use of a 3D printer or other additive manufacturing system), other devices or systems may be used to perform the same or similar operations during the approach 200. Also, the approach 200 shown here may be used to create any number of designs 202 and any number of structures 206, 210, 214, 218.

Figure 3:
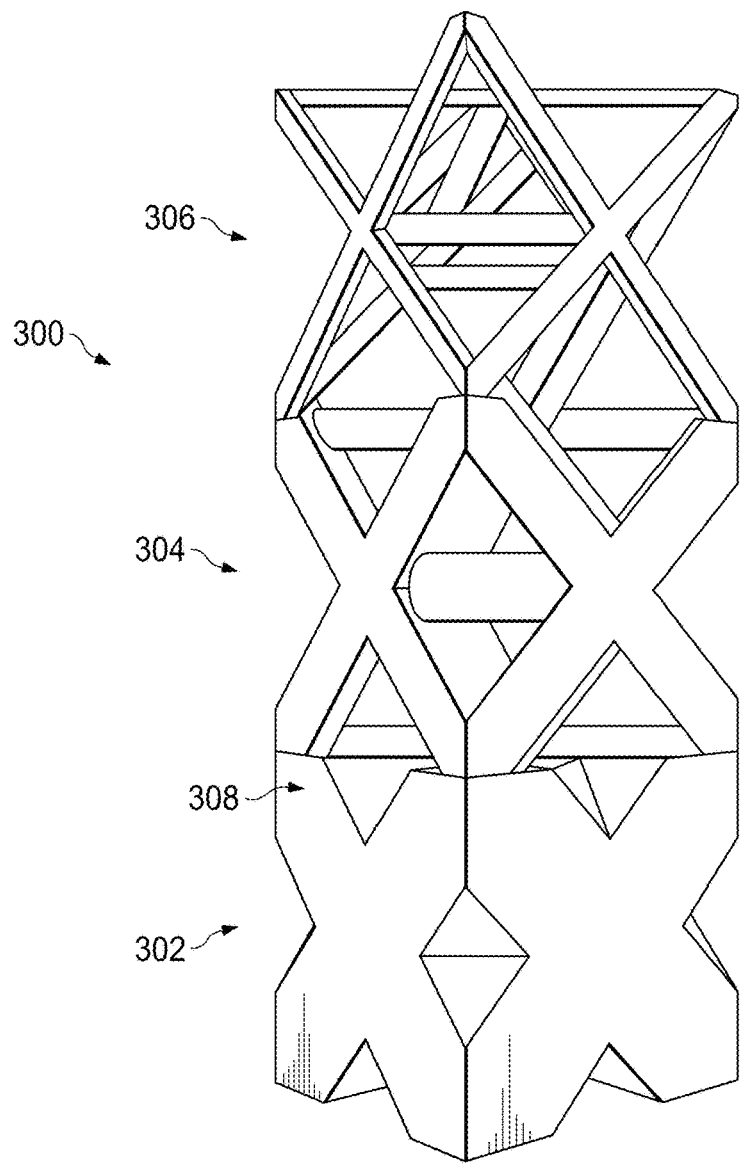
FIG. 3 illustrates how a lattice unit-cell density can vary and be controlled by throttling rod/beam dimensions during the multi-step approach of FIG. 2 in accordance with this disclosure.

As described above, the finished structure 218 can be designed to provide different mechanical properties (such as different CTEs) in different portions of the structure 218. There are various ways in which the design of the finished structure 218 can be customized to provide desired mechanical properties. For example, FIG. 3 illustrates how a lattice unit-cell density can vary and be controlled by throttling rod/beam dimensions during the multi-step approach 200 of FIG. 2 in accordance with this disclosure. As shown in FIG. 3, part of a structure 300 is illustrated, where different portions 302, 304, 306 of the structure 300 have rods/beams 308 of different dimensions. In this example, all three portions 302, 304, 306 of the structure 300 include four sides with rods/beams 308 forming an "X" pattern, plus an additional rod/beam 308 extending between two sides through the center of the portion 302, 304, 306. However, the dimensions (such as the thicknesses) of the rods/beams 308 in the portions 302, 304, 306 can differ as needed in order to provide desired mechanical properties. Thus, the density of material in each portion 302, 304, 306 of the structure 300 can be tailored to achieve the desired mechanical properties.

Figure 4:
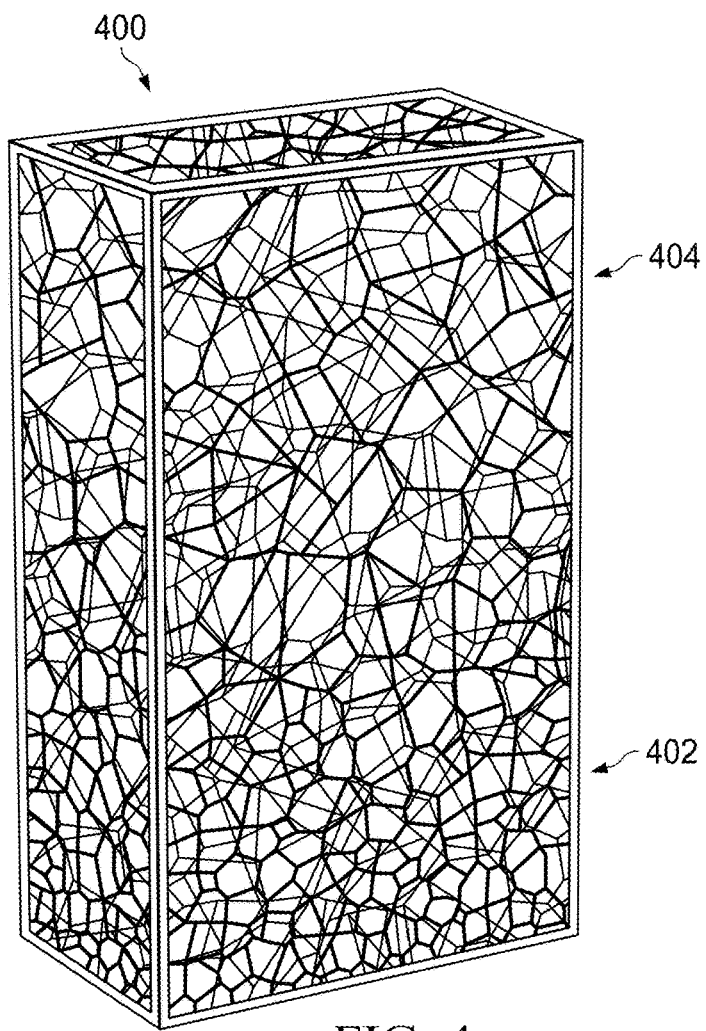
FIG. 4 illustrates how a spread of one or more materials can be generated and optimized to create a desired gradient of mechanical properties during the multi-step approach of FIG. 2 in accordance with this disclosure.

As another example, FIG. 4 illustrates how a spread of one or more materials can be generated and optimized to create a desired gradient of mechanical properties during the multi-step approach 200 of FIG. 2 in accordance with this disclosure. As shown in FIG. 4, part of a structure 400 is illustrated, where different portions 402 and 404 of the structure 400 have different distributions of material(s). More specifically, the portion 402 includes more numerous threads or strings of material that are closer together, while the portion 404 includes fewer threads or strings of material that are farther apart. Among other things, the distribution or spread of the material(s) forming the structure 400 can be generated and optimized to create a desired gradient of mechanical properties within the structure 400.

In some embodiments, a topological optimization can be performed (such as during the generation of a design 202) to control the collective volumes of the voids in the initial structure 206 to be formed relative to the collective volumes of material(s) in the initial structure 206. This can be done, for example, to help create a gradient of a mechanical property within the initial structure 206. In some cases, computational design tools, such as those used for light-weighting aerospace components or orthopedic implants, may be used here to help design the initial structure 206.

Although FIG. 3 illustrates one example of how a lattice unit-cell density can vary and be controlled by throttling rod/beam dimensions during the multi-step approach 200 of FIG. 2 and FIG. 4 illustrates one example of how a spread of one or more materials can be generated and optimized to create a desired gradient of mechanical properties during the multi-step approach 200 of FIG. 2, various changes may be made to FIGS. 3 and 4. For example, the lattice unit-cell density and/or the spread of one or more materials in a design 202 may represent two ways in which the design 202 can be controlled or modified in order to provide desired mechanical properties of the initial structure 206 or the finished structure 218. Other characteristics of the design 202 may be used to achieve desired mechanical properties of the initial structure 206 or the finished structure 218.

Figure 5:
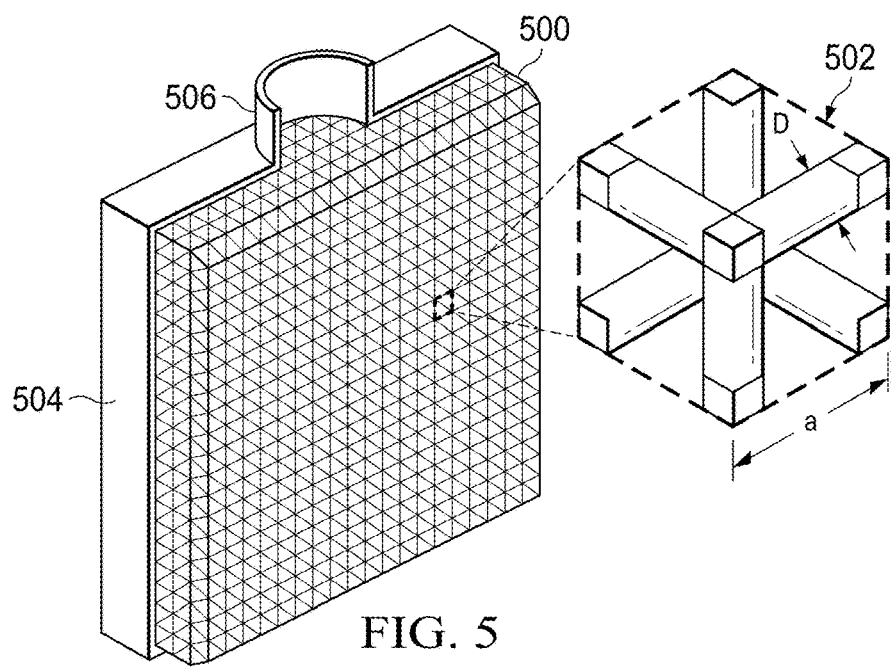
FIG. 5 illustrates an example initial structure that might be formed during the multi-step approach of FIG. 2 in accordance with this disclosure.

FIG. 5 illustrates an example initial structure 500 that might be formed during the multi-step approach 200 of FIG. 2 in accordance with this disclosure. The initial structure 500 shown here represents another example of the type of structure that may be designed and formed during the multi-step approach 200 of FIG. 2. As shown in FIG. 5, the initial structure 500 defines an array or other pattern of skeletal or reinforcement elements 502, which may be formed using molybdenum or other material(s). Each of the elements 502 can define a cube-like or other void within the initial structure 500. The overall widths of the elements 502 and the diameters of rods/beams forming the elements 502 can vary as needed or desired in different portions of the initial structure 500 to provide desired mechanical properties in a finished structure. The voids in the elements 502 can be at least partially filled during the infiltration process 208 with copper, other liquid metal(s), or other liquid material(s).

In some embodiments, the initial structure 500 may be placed into a shell 504 having a gate 506 during the infiltration process 208. Note that the shell 504 and the gate 506 are shown here in FIG. 5 in cross-sectional form so that the initial structure 500 can be seen. The shell 504 may be used to encase the initial structure 500, and the gate 506 may be used to allow molten copper or other liquid material(s) to be provided into the shell 504 (possibly under pressure) for infiltration into the initial structure 500. Infiltration is a liquid-state fabrication technique in which a porous preform (often referred to as a reinforcement or skeleton) is impregnated with a molten matrix metal or other liquid material(s), which at least partially fills pores between dispersed voids with the preform.

Although FIG. 5 illustrates one example of an initial structure 500 that might be formed during the multi-step approach 200 of FIG. 2, various changes may be made to FIG. 5. For example, any other suitable structure may be designed and formed during the multi-step approach 200 of FIG. 2. Also, the infiltration process 208 may or may not involve the use of a shell 504 having a gate 506.

Figure 6:
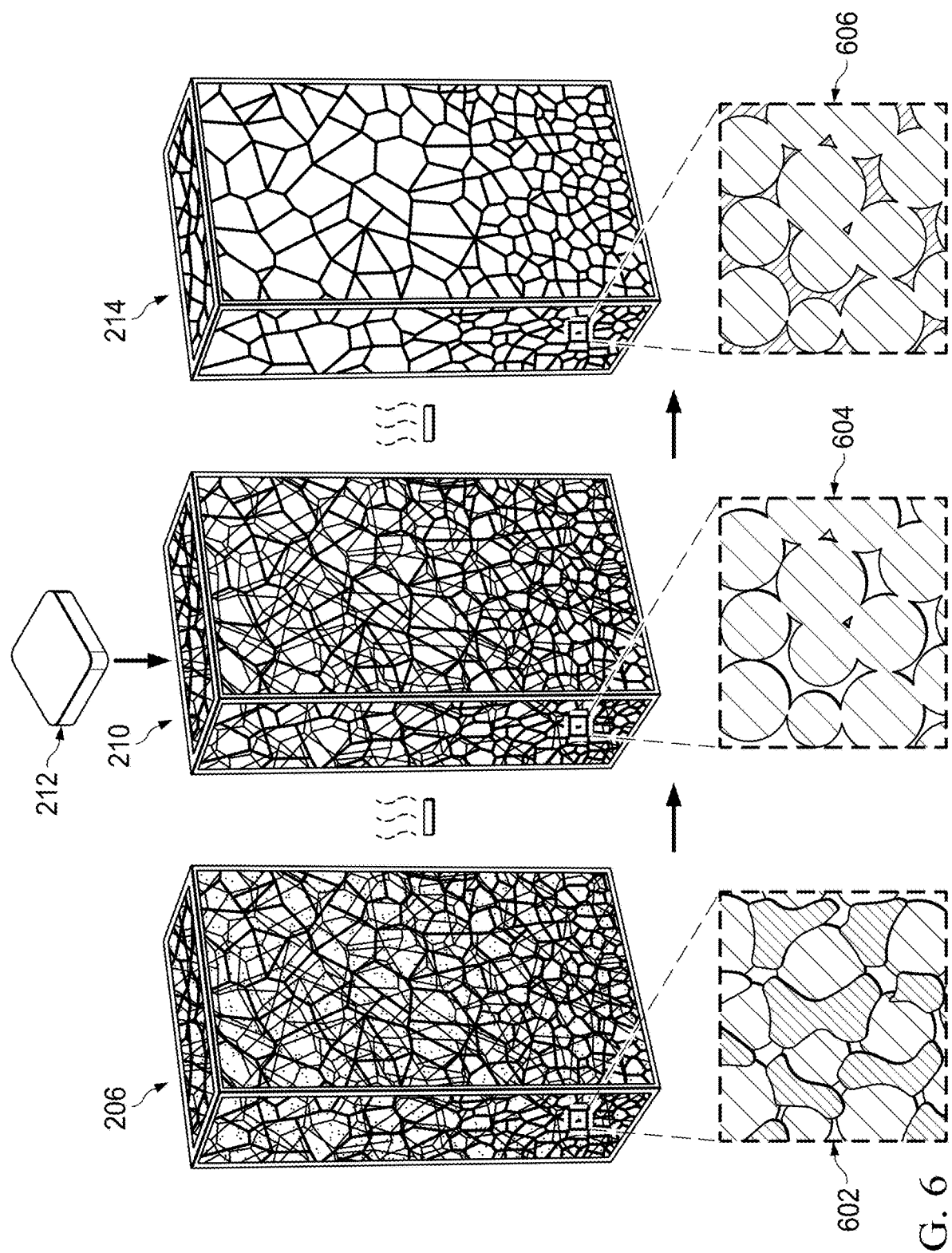
FIG. 6 illustrates an example infiltration of an initial structure during the multi-step approach of FIG. 2 in accordance with this disclosure.

FIG. 6 illustrates an example infiltration 600 of an initial structure during the multi-step approach 200 of FIG. 2 in accordance with this disclosure. Note that while the example infiltration 600 shown here involves the structures 206, 210, 214 described above with respect to FIG. 2, an infiltration may occur using any other suitable structures that are described above or that are designed in accordance with this disclosure.

As shown in FIG. 6, the initial structure 206 may include an initial distribution 602 of metallic or other particles, binders or impurities, and empty (air-filled) voids. After sintering, the sintered structure 210 has a distribution 604 of metallic or other particles that are generally attached together, along with various voids between the particles. After infiltration, the infiltrated structure 214 has a distribution 606 of metallic or other particles that are generally attached together, and the voids between the particles have been at least partially filled by metal or other filler material. Note that while not shown here, some voids may remain at least partially unfilled during the infiltration, in which case there may be some particles separated from one another by empty voids even after the infiltration.

Among other things, it is possible to control the amounts and distributions of the different materials in the infiltrated structure 214 in order to achieve desired CTEs or other mechanical properties in different portions of the finished structure 218. This may allow, for example, the resulting finished structure 218 to have a desired CTE in one portion (which is attached to one or more semiconductor devices 104 or other components) and a different CTE in another portion (which is attached to a heat sink or other structure). Ideally, the CTE of the portion attached to the one or more semiconductor devices 104 or other components can match the CTE of the one or more components themselves or at least be close enough that less than a threshold amount of stress is created due to CTE mismatches between the finished structure 218 and the one or more components.

Although FIG. 6 illustrates one example of an infiltration 600 of an initial structure during the multi-step approach 200 of FIG. 2, various changes may be made to FIG. 6. For example, the distributions 602, 604, 606 shown in FIG. 6 are for illustration only and can vary based on a number of factors, such as the design of the initial structure and how the sintering and infiltration operations are performed during the multi-step approach 200.

Figure 7A:
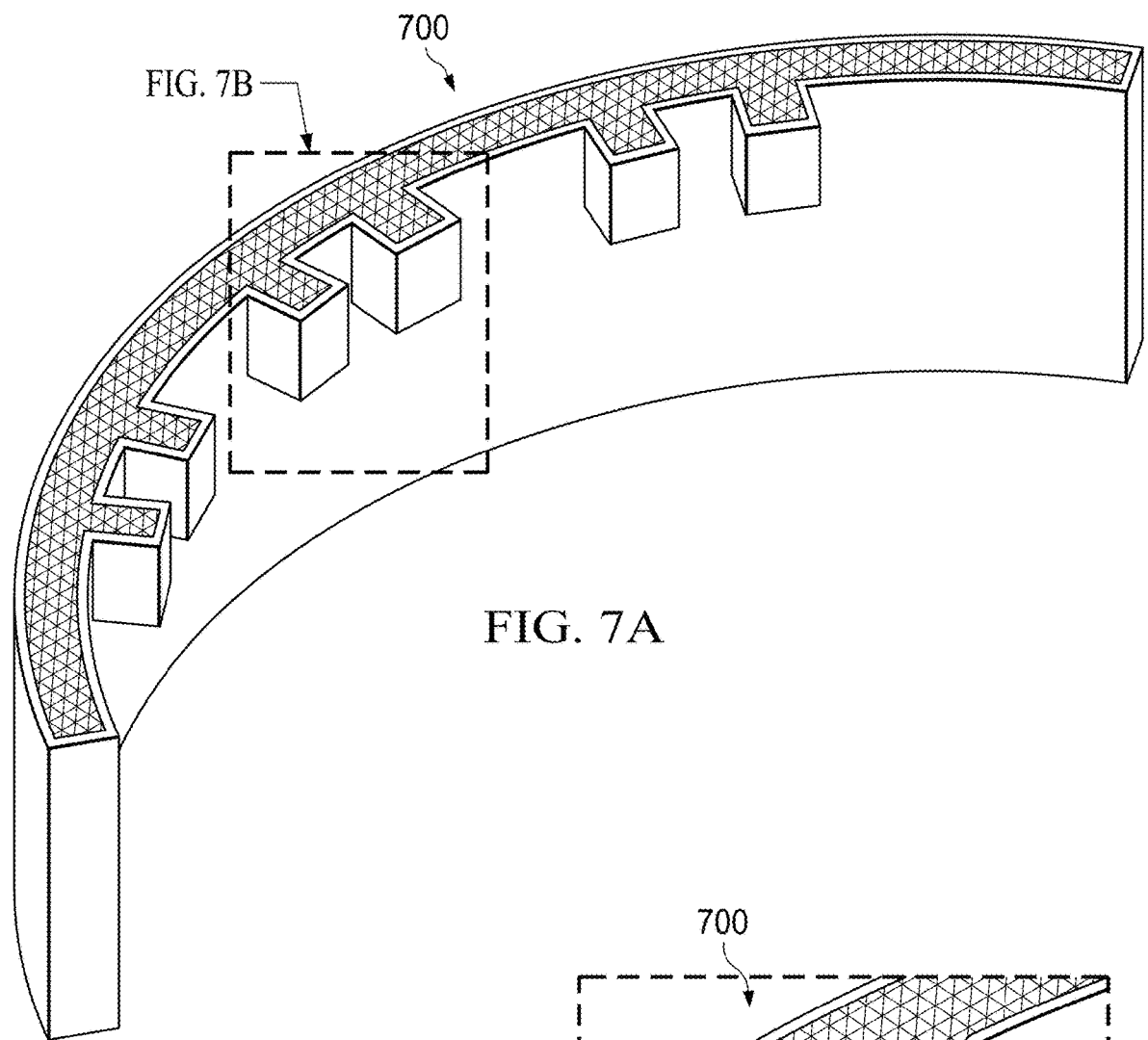
FIGS. 7A and 7B illustrate an example cold plate that may be fabricated during the multi-step approach of FIG. 2 and installed inside a tube with a circular cross-section in accordance with this disclosure.
Figure 7B:
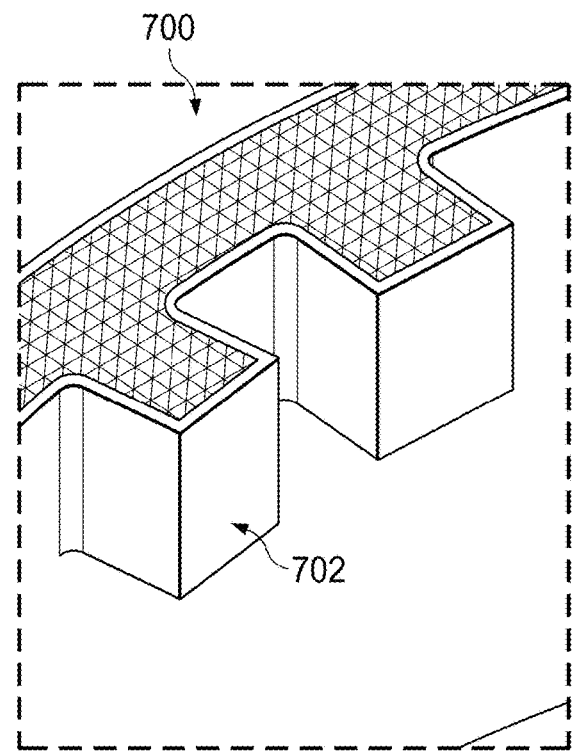

The approach 200 described above may be used to form any desired structures to be used to support and remove thermal energy from one or more heat-generating components. For example, FIGS. 7A and 7B illustrate an example cold plate 700 that may be fabricated during the multi-step approach 200 of FIG. 2 and installed inside a tube with a circular cross-section in accordance with this disclosure. More specifically, FIG. 7A illustrates an example cold plate 700 that may be fabricated and installed inside a tube with a circular cross-section, and FIG. 7B illustrates an enlarged portion of FIG. 7A showing one or more raised pedestals 702 of the cold plate 700. The one or more raised pedestals 702 may be CTE-matched to one or more MMICs or other components.

As can be seen here, the approach 200 described above may be used to design and fabricate structures having any suitable complex geometries using one or more refractory metals or other material(s). The approach 200 also allows thermal designers to utilize a new tool for designing conductive cooling schemes and provide new possibilities for quick-turn, complex, and conformal geometry thermal parts. In addition, the approach 200 supports potential growth by incorporating technologies directly into fluid-controlled cold plates or other structures. Note, however, that the specific materials and details provided above are merely examples of how the described approach 200 may be used. Other components may be fabricated using different materials and/or in different forms.

Although FIGS. 7A and 7B illustrate one example of a cold plate 700 that may be fabricated during the multi-step approach 200 of FIG. 2 and installed inside a tube with a circular cross-section, various changes may be made to FIGS. 7A and 7B. For example, the cold plate 700 may have any suitable number of pedestals 702 in any suitable arrangement. Also, the cold plate 700 shown here is simply one additional example of the types of structures that may be designed and fabricated using the multi-step approach 200 of FIG. 2.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112 (f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112 (f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. An apparatus comprising:
    an initial structure comprising voids, the initial structure comprising one or more first materials; and
    one or more second materials infiltrated into the initial structure, the one or more second materials different from the one or more first materials;
    wherein the apparatus is configured to receive and support one or more heat-generating components;
    wherein a combination of the first and second materials provides a coefficient of thermal expansion in a portion of the apparatus that substantially matches a coefficient of thermal expansion of the one or more heat-generating components; and
    wherein the apparatus is configured to provide a path to remove thermal energy from the one or more heat-generating components.

2. The apparatus of claim 1, wherein the initial structure comprises a structure formed using additive manufacturing.

3. The apparatus of claim 1, wherein the initial structure comprises a structure formed using a laser powder bed fusion process.

4. The apparatus of claim 1, wherein:
    the one or more first materials comprise molybdenum; and
    the one or more second materials comprise copper.

5. The apparatus of claim 1, wherein the initial structure has multiple regions of different mechanical properties.

6. The apparatus of claim 5, wherein the different mechanical properties comprise at least one of: different coefficients of thermal expansion and different stiffnesses.

7. The apparatus of claim 1, wherein the apparatus comprises a heatsink configured to remove the thermal energy from the one or more heat-generating components.

8. A system comprising:
    one or more heat-generating components; and
    an apparatus configured to support the one or more heat-generating components and remove thermal energy from the one or more heat-generating components, the apparatus comprising:
        an initial structure comprising voids, the initial structure comprising one or more first materials; and
        one or more second materials infiltrated into the initial structure, the one or more second materials different from the one or more first materials;
        wherein a combination of the first and second materials provides a coefficient of thermal expansion in a portion of the apparatus that substantially matches a coefficient of thermal expansion of the one or more heat-generating components; and
        wherein the apparatus is configured to provide a path to remove the thermal energy from the one or more heat-generating components.

9. The system of claim 8, wherein the initial structure comprises a structure formed using additive manufacturing.

10. The system of claim 8, wherein the initial structure comprises a structure formed using a laser powder bed fusion process.

11. The system of claim 8, wherein:
    the one or more first materials comprise molybdenum; and
    the one or more second materials comprise copper.

12. The system of claim 8, wherein the initial structure has multiple regions of different mechanical properties.

13. The system of claim 12, wherein the different mechanical properties comprise at least one of: different coefficients of thermal expansion and different stiffnesses.

14. A method comprising:
    forming an initial structure comprising voids, the initial structure comprising one or more first materials;
    infiltrating one or more second materials into the initial structure, the one or more second materials different from the one or more first materials; and
    forming a finished structure configured to receive and support one or more heat-generating components;
    wherein a combination of the first and second materials provides a coefficient of thermal expansion in a portion of the finished structure that substantially matches a coefficient of thermal expansion of the one or more heat-generating components; and wherein the finished structure is configured to provide a path to remove thermal energy from the one or more heat-generating components.

15. The method of claim 14, wherein forming the initial structure comprises forming the initial structure using additive manufacturing.

16. The method of claim 14, wherein forming the initial structure comprises forming the initial structure using a laser powder bed fusion process.

17. The method of claim 14, wherein:
the one or more first materials comprise molybdenum; and
the one or more second materials comprise copper.

18. The method of claim 14, wherein the initial structure has multiple regions of different mechanical properties.

19. The method of claim 18, wherein the different mechanical properties comprise at least one of: different coefficients of thermal expansion and different stiffnesses.

20. The method of claim 14, wherein the finished structure comprises a heatsink configured to remove the thermal energy from the one or more heat-generating components.

* * * * *